United States Patent [19]

Mizukami et al.

[11] Patent Number: 5,333,986
[45] Date of Patent: Aug. 2, 1994

[54] TRANSFER APPARATUS

[75] Inventors: Masami Mizukami; Hatsuo Osada, both of Yamanashi, Japan

[73] Assignee: Tokyo Electron Limited, Tokyo, Japan

[21] Appl. No.: 921,258

[22] Filed: Jul. 29, 1992

[30] Foreign Application Priority Data

Jul. 29, 1991 [JP] Japan .................... 3-211649

[51] Int. Cl.$^5$ .................... B25J 21/00
[52] U.S. Cl. .................... 414/217; 74/10.7; 74/96; 74/479 BF; 74/489 BJ; 414/222; 414/744.5; 414/744.6; 414/749; 414/917; 414/935; 414/939; 901/21; 901/28
[58] Field of Search ............ 414/744.1, 744.2, 744.4, 414/744.5, 744.6, 749, 917, 751, 752, 222, 225, 217, 937, 939, 935; 901/15, 21, 23, 25, 28; 74/96, 89.22, 506, 479 BJ, 479 BF, 479 BP, 479 BW

[56] References Cited

U.S. PATENT DOCUMENTS

| 2,477,252 | 7/1949 | Hutchings | 180/291 |
| 4,596,377 | 6/1986 | Taylor | 74/96 X |
| 4,702,668 | 10/1987 | Carlisle et al. | 414/744.5 |
| 4,749,330 | 6/1988 | Hine | 414/744.5 |
| 4,909,701 | 3/1990 | Hardegen | 414/744.6 X |
| 4,951,601 | 8/1990 | Maydan et al. | 414/937 X |
| 4,990,047 | 2/1991 | Wagner et al. | 414/935 X |
| 5,151,008 | 9/1992 | Ishida et al. | 414/749 |

FOREIGN PATENT DOCUMENTS

| 60-61191 | 4/1985 | Japan . |
| 60-183736 | 9/1985 | Japan . |
| 292153 | 12/1990 | Japan | 414/744.5 |

Primary Examiner—Donald W. Underwood
Attorney, Agent, or Firm—Oblon, Spivak, McClelland, Maier & Neustadt

[57] ABSTRACT

A transfer apparatus for transferring a semiconductor wafer has a base provided with a rotary driving source, and four arms having the same length. A first inner arm has an end fixed to the rotary driving shaft, and the other end fixed to a first coupling shaft. A second inner arm has an end supported by the base such that it can rotate about a pivotal point, and the other end is rotatably connected to a second coupling shaft. A transmission mechanism is provided between the first and second coupling shafts. A first outer arm has an end rotatably connected to the first coupling shaft, and a second outer arm has an end fixed to the second coupling shaft. The other ends of the first and second outer arms are rotatably connected to a supporting plate having a wafer-holding portion. The four arms are arranged so as to have a link structure in the form of a parallelogram, which enables linear transfer of a wafer.

20 Claims, 8 Drawing Sheets

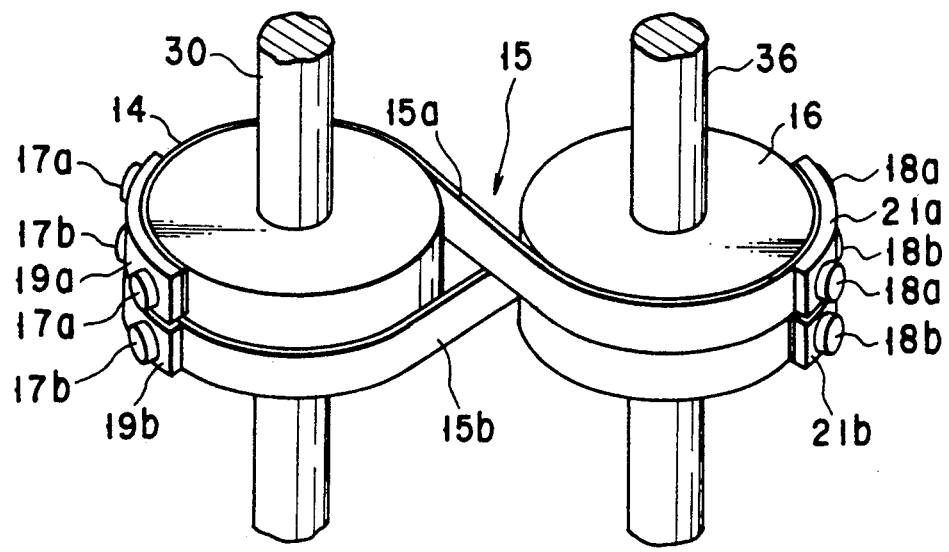
F I G. 3
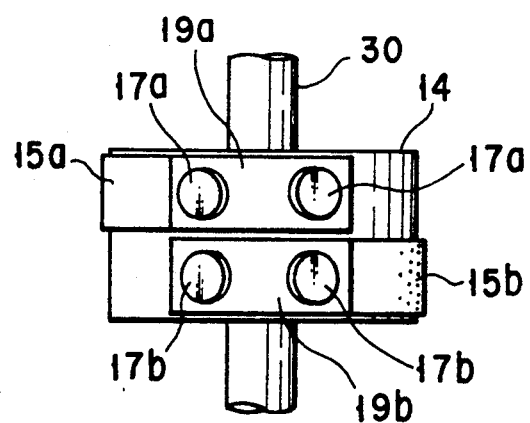
F I G. 4

TRANSFER APPARATUS

BACKGROUND OF THE INVENTION

1. Field of the Invention

This invention relates to an apparatus for transferring an article to a predetermined location by converting rotational movement to linear movement.

2. Description of the Related Art

In each step of the conventional process of manufacturing semiconductor devices, a frog-leg-type or a belt-type transfer apparatus is used. This transfer apparatus transfers semiconductor wafers from a clean room to a process chamber at which a predetermined process is performed, or transfers processed wafers from the process chamber to the clean room.

The transfer apparatus is generally provided in a load lock chamber connected to the process chamber via a gate device such as a gate valve. The transfer apparatus transfers wafers from the clean room into the load lock chamber, and then to the process chamber after pressure in the load lock chamber is reduced to a vacuum value.

In a belt-type transfer apparatus, a belt with semiconductor wafers placed thereon is moved to thereby transfer the wafers. A belt transmission mechanism employed in the transfer apparatus is large, and accordingly the entire apparatus is large. Thus, a large load lock chamber and a large gate device must be used.

Frog-leg-type transfer apparatuses are disclosed, for example, in WO84/03196 (Published Unexamined Japanese Patent Application No. 60-183736) and in Published Unexamined Utility Model Application No. 60-61191. In a transfer apparatus of this type, two pairs of links are connected in series by means of coupling shafts, and a fork or the like is attached to the ends of the links. Wafers placed on the fork are transferred in the forward and backward directions by folding and unfolding the frog-like links.

This frog-leg-type transfer apparatus can be made smaller than the above-described belt-type apparatus. However, the load lock chamber employed in the frog-leg-type transfer apparatus must be larger than at least a circle formed assuming one link to be the radius, since the two pairs of coupled links are folded and unfolded to thereby transfer wafers. In addition, each link is long relative to the stroke of movement of a wafer, which requires large chambers.

Further, the frog-leg-type transfer apparatus also needs gears provided at the ends of the links for smoothly folding and unfolding the links. Those ends are inevitably thick, and hence the gate device provided at the junction of a process chamber must be made large.

SUMMARY OF THE INVENTION

It is an object of the invention to provide a transfer apparatus having a short arm capable of providing a long stroke of movement.

It is another object of the invention to provide a transfer apparatus suitable for use in a load lock chamber.

To attain the above objects, the transfer apparatus of the invention comprises:

a base;

a rotary driving source mounted on the base, the driving source having a rotary driving shaft;

a first arm having an end fixed to the rotary driving shaft;

a first coupling shaft fixed to the other end of the first arm;

a second arm having an end supported by the base such that it can pivot about a pivotal point;

a second coupling shaft rotatably supported by the other end of the second arm, the distance between the predetermined pivotal point and the second coupling shaft being equal to that between the rotary driving shaft and the first coupling shaft;

a holding member for rotatably holding the first and second coupling shafts, the distance between the first and second coupling shafts being equal to that between the rotary driving shaft and the pivotal point, a straight line connecting the first and second coupling shafts to each other being parallel to a straight line connecting the rotary driving shaft to the pivotal point;

transmission means for transmitting a rotational force of the first coupling shaft to the second coupling shaft to thereby rotate the same in a direction opposite to that of rotation of the first coupling shaft;

a first outer arm having an end rotatably supported by the first coupling shaft;

a second outer arm having an end secured to the second coupling shaft;

a supporting plate having an end connected to the other ends of the first and second outer arms, the first and second outer arms being connected to the supporting plate such that they can rotate about first and second points, respectively, the distance between the first coupling shaft and the first point being equal to that between the rotary driving shaft and the first coupling shaft, and also equal to the distance between second coupling shaft and the second point, the distance between the first and second points being equal to that between the first and second coupling shafts, a straight line connecting between the first and second points being parallel to that connecting between the first and second coupling shafts; and a supporting portion formed on a free end of the supporting plate for supporting the article.

In the transfer apparatus of the invention, the four arms have a link structure in the form of a parallelogram, which enables linear transfer of an article such as a wafer. The supporting plate supporting an article moves linearly in the forward and backward directions along the bottoms of isosceles triangles having oblique lines formed by the inner and outer arms.

By virtue of the above structure, the article can be transferred in both forward and backward directions, and rather short arms relative to the stroke of transfer can be used. Accordingly, the entire apparatus can be made compact and simple in structure, and the number of required components can be reduced.

Further, generation of particles due to friction can be prevented by transmitting the rotational force of the first coupling shaft to the second coupling shaft via transmission means comprising a belt or a cord. Also, in this case, no grease is needed. Thus, no problems will occur even if the apparatus is used in such a clean vacuum room as a load lock chamber in a semiconductor manufacturing device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a perspective view showing a transmission mechanism employed in the apparatus of FIG. 1;

FIG. 4 is a side view showing the transmission mechanism;

DESCRIPTION OF THE PREFERRED EMBODIMENTS

The embodiments of the invention will now be explained with reference to the accompanying drawings.

Figure 1:
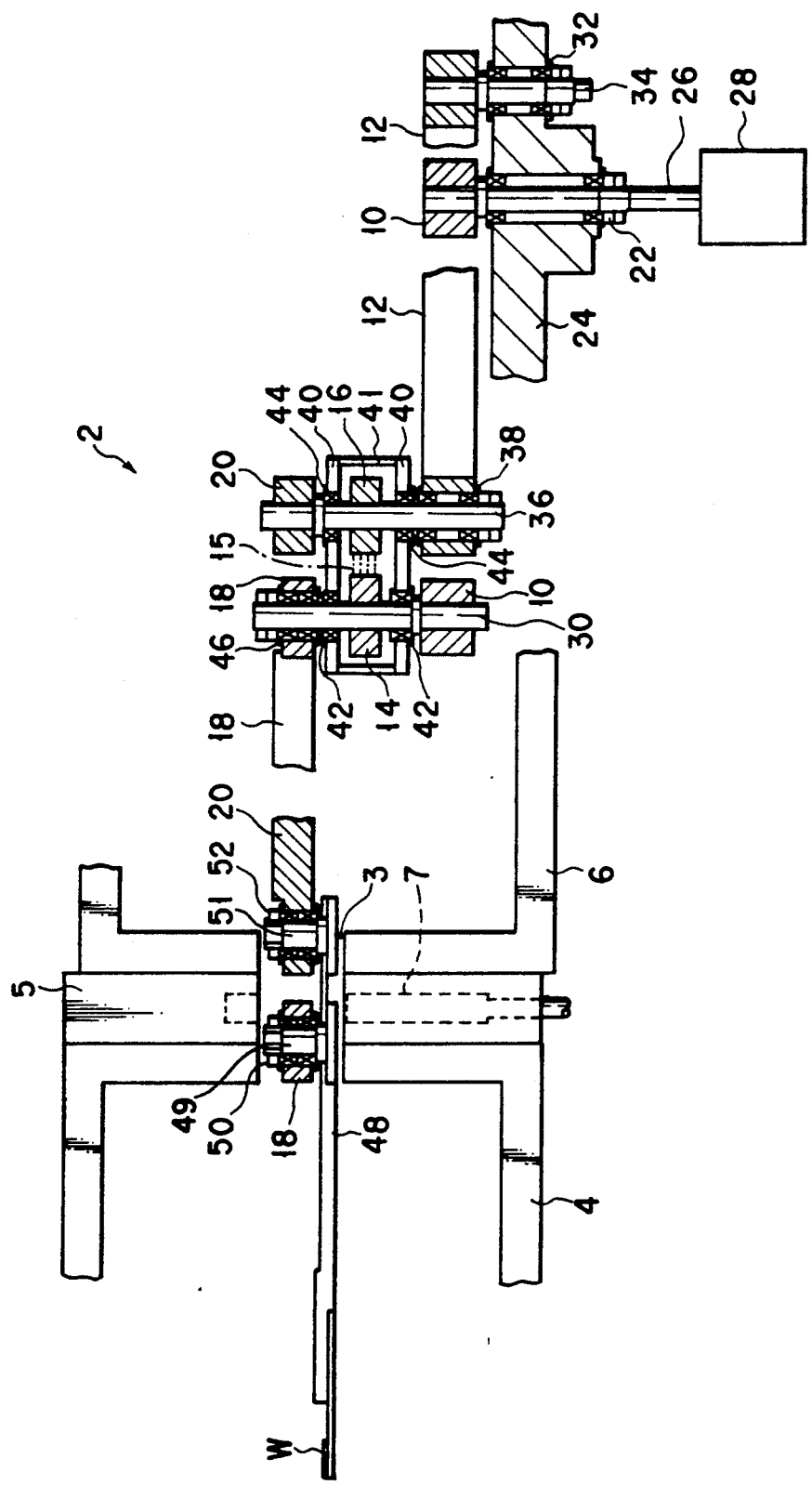
FIG. 1 is a cross sectional view, showing a transfer apparatus according to a first embodiment of the invention.
Figure 13:
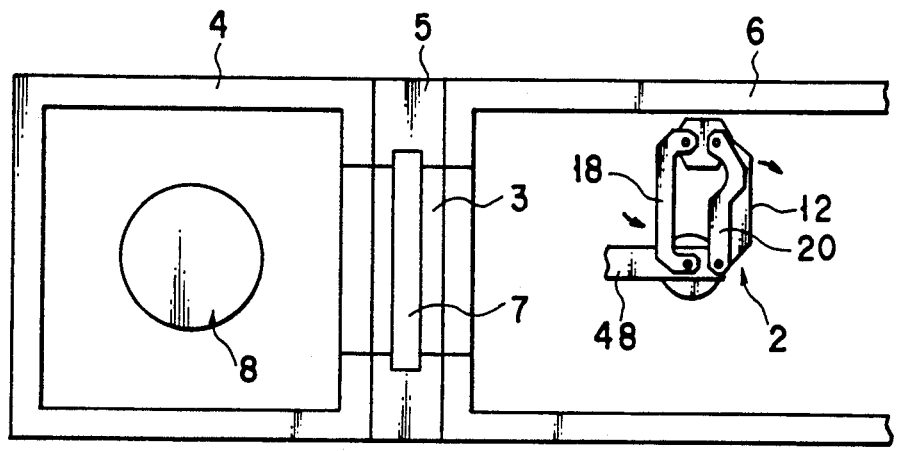
FIG. 13 is a plan view, showing the positional relationship between a process chamber, a load lock chamber, and the transfer apparatus of FIG. 1.

As is shown in FIGS. 1 and 13, a transfer apparatus 2 according to the invention is provided in a load lock chamber 6 adjacent to a process chamber 4. The chambers 4 and 6 are employed in a semiconductor processing apparatus, such as a PVD apparatus, CVD apparatus, etching apparatus, or ion injection apparatus, in which one wafer is processed at a time. The chambers 4 and 6 are connected to each other by means of a gate device 5. The gate device 5 has a gate 7 for opening and closing a passage 3 which allows the process chamber 4 to communicate with the load lock chamber 6.

A semiconductor wafer is transferred by the transfer apparatus 2 from the clean room to the load lock chamber 6. Pressure in the chamber 6 is reduced to a vacuum. Thereafter, the wafer is transferred by the apparatus 2 in a vacuum atmosphere, onto a susceptor 8 located in the process chamber 4.

Figure 2:
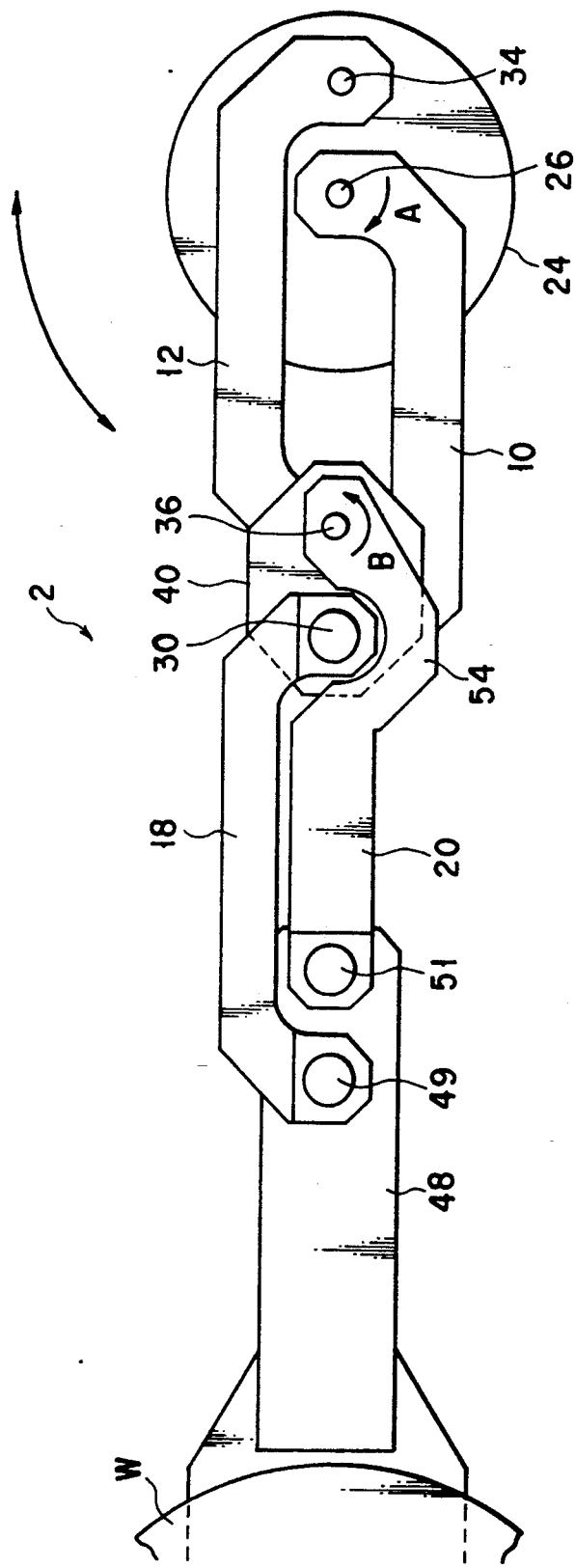
FIG. 2 is a plan view showing the apparatus of FIG. 1.
Figure 5:
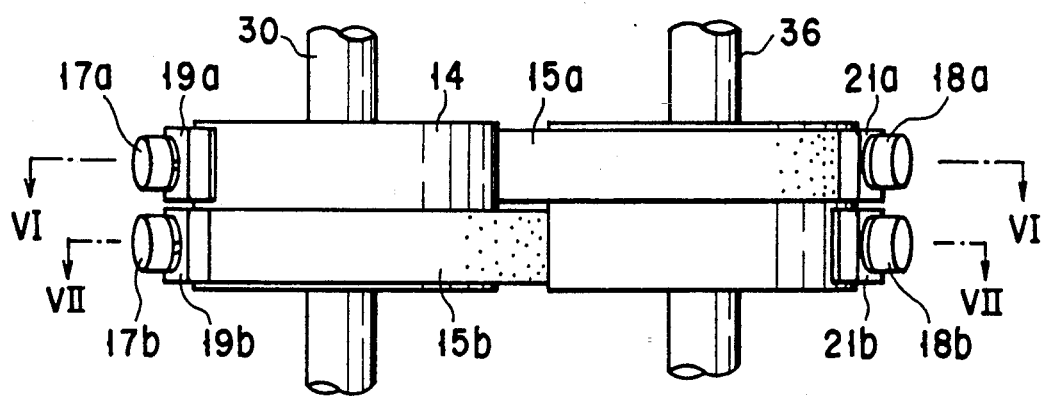
FIG. 5 is a front view showing the transmission mechanism.
Figure 6:
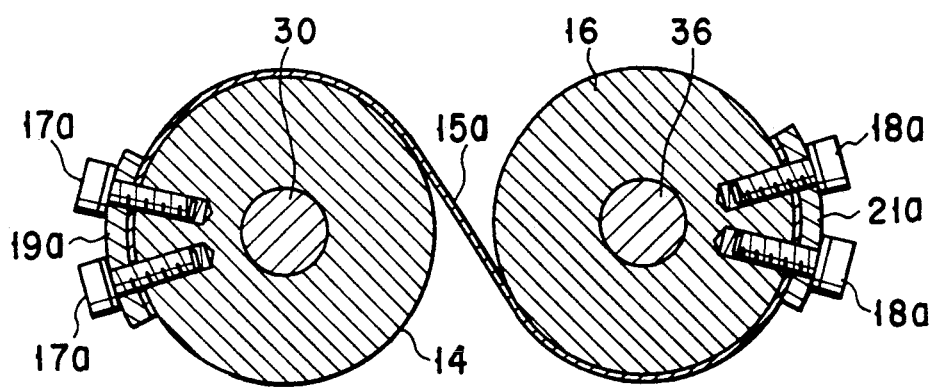
FIG. 6 is a cross sectional view taken along line VI—VI in FIG. 5.
Figure 7:
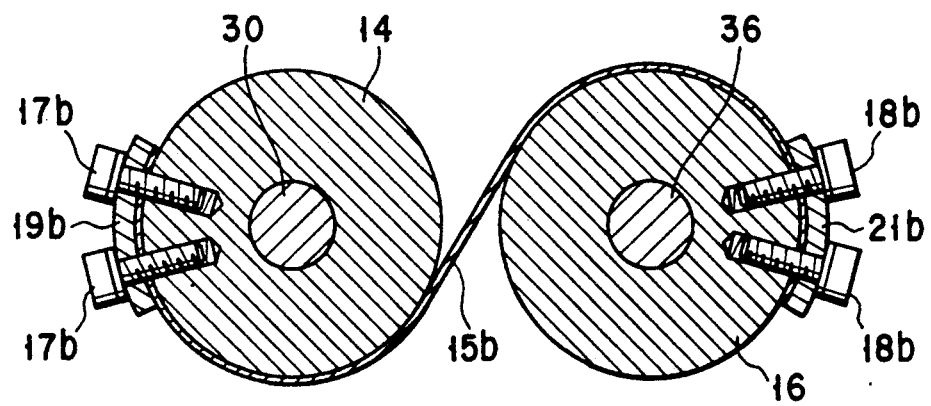
FIG. 7 is a cross sectional view taken along line VII—VII in FIG. 5.

The transfer apparatus 2 shown in FIGS. 1 and 2 and according to a first embodiment of the invention has two pairs of arms 10, 12, 18, and 20. The arms 10 and 18 are kept parallel with the arms 12 and 20, respectively. These arms are made of, for example, aluminum, and have the same length (i.e., the distance between a pair of axes).

A first inner arm 10 has both opposite end portions bent, thereby being shaped like character "U". One end of the arm 10 is fixed to the upper end of a rotary driving shaft 26 rotatably supported by a base 24, with a bearing 22 interposed therebetween. The lower end of the shaft 26 is coupled with a rotary driving source 28 comprising, for example, an AC servo motor. Thus, the rotary driving shaft 26 rotates in accordance with rotation of the rotary driving source 28, thereby rotating the first inner arm 10 formed integrally with the shaft 26. A first coupling shaft 30 extending upward is fixed on the other end of the arm 10.

A second inner arm 12 having a shape similar to that of the first inner arm 10 is opposed to the latter in parallel therewith.

One end of the second inner arm 12 is fixed to a rotary shaft 34 rotatably supported by the base 24 via a bearing 32. The one end of the arm 12 is deviated by a slight distance from the one end of the first arm 10 in the direction of transfer of the wafer W. A second coupling shaft 36 extending upward is rotatably connected to the other end of the arm 12 via a bearing 38.

A pair of upper and lower holding plates 40 are provided to the first and second coupling shafts 30 and 36, with bearings 42 and 44 respectively interposed therebetween, so as to prevent the shafts from being separated. These plates 40 are partially coupled with each other by means of a detachable member 41.

The distance between the first and second coupling shafts 30 and 36 is set equal to that between the shafts 26 and 34. These shafts 30, 36, 26, and 34 are arranged such that a straight line connecting the shafts 30 and 36 is parallel with that connecting the shafts 26 and 34. Thus, the first and second inner arms 10 and 12 which have the same length are arranged parallel with each other.

Between the upper and lower holding plates 40, first and second pulleys 14 and 16 are fixed to the first and second coupling shafts 30 and 36, respectively. The first and second pulleys 14 and 16 rotate together with the first and second shafts 30 and 36, respectively. The pulleys 14 and 16 are made of stainless steel, and have the same diameter.

As will be hereinafter explained in detail, transmission means 15 are provided between the pulleys 14 and 16 for transmitting a rotational force of the first coupling shaft 30 to the second coupling shaft 36 to thereby rotate the same in a direction opposite to that of rotation of the first coupling shaft 30. By virtue of the transmission means 15, when the first coupling shaft 30 and pulley 14 rotate, for example, clockwise through $\theta°$, the second coupling shaft 36 and pulley 16 rotate counterclockwise through $\theta°$.

An end of a first outer arm 18 is pivotally secured to the upper end of the first coupling shaft 30 via a bearing 46. A thin-platelike fork 48 for holding the semiconductor wafer W is pivotally secured to the other end of the arm 18 via a shaft 49 and a bearing 50.

An end of a second outer arm 20 is fixed to the upper end of the second coupling shaft 36, enabling the arm 20 to rotate together with the shaft 36. The second outer arm 20 is parallel with the first outer arm 18. The fork 48 is pivotally secured to the other end of the arm 20 via a shaft 51 and a bearing 52. The second outer arm 20 has a shape slightly differing from that of the other arms. The arm 20 is generally linear except for its intermediate U-shaped portion 54. This portion 54 is formed so as not to collide with the upper end of the first coupling shaft 30. However, the arm 20 may have the same shape as the other arms.

The distance between the rotary shafts 49 and 51 respectively provided at the other ends of the first and second outer arms 18 and 20 is set equal to that between the first and second coupling shafts 30 and 36, and also to that between the shafts 26 and 34 respectively provided at the one ends of the first and second inner arms 10 and 12. Further, a straight line connecting the shafts 49 and 51 to each other is set parallel to that connecting the shafts 30 and 36 to each other, and also to that connecting the shafts 26 and 34 to each other. Thus, the first and second outer arms 18 and 20, which have the same length, are kept parallel with each other.

The base 24 can rotate through 180°, so as to transfer the wafer W to a clean room (not shown).

FIGS. 3 to 7 show the transmission mechanism provided between the first and second coupling shafts 30 and 36.

As is shown in these figures, the transmission means 15 comprising a pair of upper and lower belts 15a and 15b, which are made of stainless steel and bridge the first and second pulleys 14 and 16 such that they cross each other.

Specifically, in the state shown in FIG. 3, substantially half of the upper belt 15a is wound on an upper circumferential surface of the first pulley 14 through approx. 180° in the counterclockwise direction, and is fixed to the pulley 14 at an end thereof by means of a curved plate washer 19a, and a pair of bolts 17a. The other substantial half of the belt 15a is wound on an upper circumferential surface of the second pulley 16 through approx. 180° in the counterclockwise direction, and is fixed to the pulley 16 at the other end thereof by means of a curved plate washer 21a, and a pair of bolts 18a.

Similarly, a substantially half of the lower belt 15b is wound on a lower circumferential surface of the first pulley 14 through approx. 180° in the clockwise direction, and is fixed to the pulley 14 at an end thereof by means of a curved plate washer 19b, and a pair of bolts 17b. The other substantial half of the belt 15b is wound on a lower circumferential surface of the second pulley 16 through approx. 180° in the clockwise direction, and is fixed to the pulley 16 at the other end thereof by means of a curved plate washer 21b, and a pair of bolts 18b.

Thus, clockwise rotation of the first coupling shaft 30 and first pulley 14 drives, via the lower belt 15b, the second pulley 16 and second coupling shaft 36 to rotate counterclockwise. Similarly, counterclockwise rotation of the first coupling shaft 30 and first pulley 14 drives, via the upper belt 15a, the second pulley 16 and second coupling shaft 36 to rotate clockwise.

In this transmission mechanism, no friction is caused between the pulleys 14, 16 and belts 15a, 15b, so there is little possibility of causing the production of particles of steel. In addition, no grease is needed, and hence there is no possibility of occurrence of a contaminative gas. Therefore, the atmosphere in the load lock chamber 6 can be kept clean under vacuum, which enhances the yield of semiconductor wafers.

Then, the operation of the transfer apparatus 2 of the invention will be explained with reference to FIGS. 8 to 12.

Figure 8:
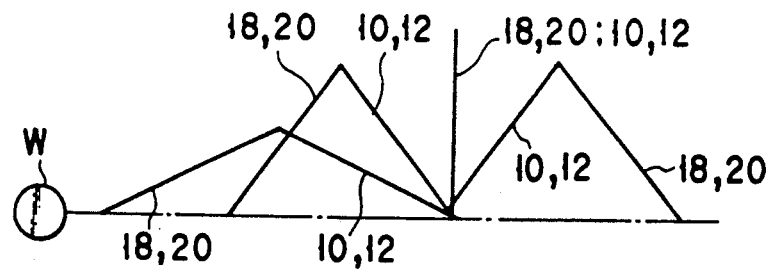
FIG. 8 is a view, useful in roughly explaining the operation of the transfer apparatus.

FIG. 8 roughly shows the entire operation of the transfer apparatus 2. The first and second inner arms 10 and 12 are roughly indicated by a single line, since they move parallel with each other. For the same reason, the first and second outer arms 18 and 20 are also indicated by a single line. As is evident from FIG. 8, the semiconductor wafer W is transferred along the bottoms of isosceles triangles each having oblique lines 10 (12) and 18 (20).

Figure 9:
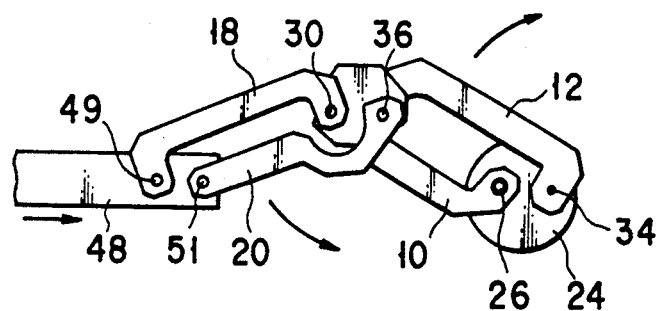
FIG. 9 is a plan view, showing a state of the transfer apparatus assumed during operation.
Figure 10:
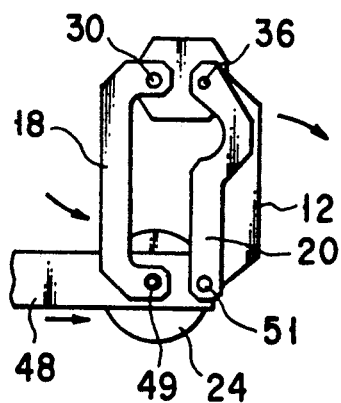
FIG. 10 is a plan view, showing another state of the transfer apparatus assumed during operation.
Figure 11:
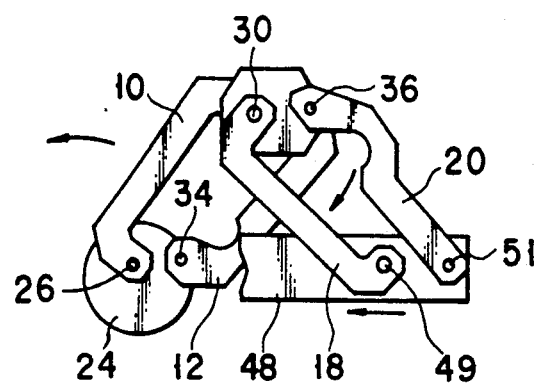
FIG. 11 is a plan view, showing a further state of the transfer apparatus assumed during operation.

FIGS. 9 to 11 shows the operations of the inner arms 10 and 12 and outer arms 18 and 20 in detail. Assume that where the inner and outer arms 10, 12, 18, and 20 are arranged straight as shown in FIG. 2, the rotary driving source 28 drives the rotary driving shaft 26 to rotate clockwise as shown by the arrow A in FIG. 2.

Then, the first inner arm 10 having its end fixed to the shaft 26 rotates clockwise. The second inner arm 12 rotates clockwise and in parallel with the arm 10 in accordance with the rotation thereof, as is shown in FIG. 9.

The first coupling shaft 30 fixed to the other end of the first inner arm 10, and the first pulley 14 secured to the shaft 30 rotate clockwise in accordance with the rotation of the arm 10. The rotation of the pulley 14 and shaft 30 is transmitted to the second pulley 16 via the lower belt 15b, and the second pulley 16 and second coupling shaft 36 rotate counterclockwise. Accordingly, the second outer arm 20 having its end secured to the second coupling shaft 36 rotates counterclockwise. The first outer arm 18 rotates counterclockwise and in parallel with the arm 20. As a result, the fork 48 holding the wafer w is linearly transferred from the process chamber 4 (see FIG. 1) to the load lock chamber 6.

As is shown in FIG. 10, the inner arms 10 and 12 are superposed upon the outer arm 18 and 20, respectively in accordance with the rotation of the rotary driving shaft 26. Thereafter, as shown in FIG. 11, the outer arms 18 and 20 are moved to pass the rotary driving shaft 26, and are retracted. At this time, the driving source 28 is stopped. Then, when the source 28 is again operated to thereby rotate the rotary driving shaft 26 counterclockwise, the arms 10 and 12 rotate counterclockwise. Accordingly, the outer arms 18 and 20 are rotated clockwise by means of the upper belt 15a, thereby extending the entire transfer apparatus to transfer the wafer W into the process chamber 4.

Figure 12:
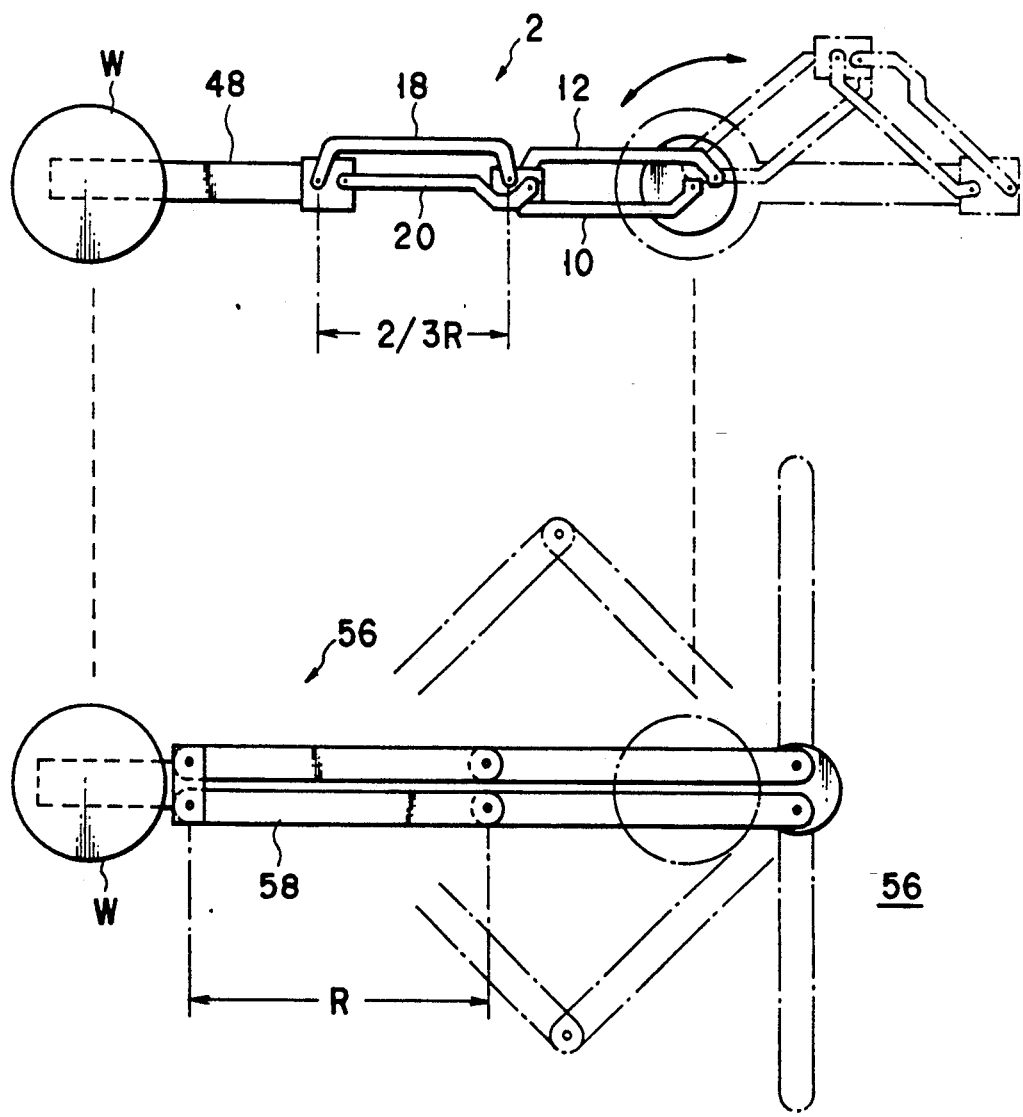
FIG. 12 is a view, useful in comparing the stroke of the transfer apparatus of the invention with that of the conventional frog-leg-type transfer apparatus.

FIG. 12 is a view, useful in comparing the stroke of the transfer apparatus 2 of the invention with that of a conventional frog-leg-type transfer apparatus 56. As is evident from FIG. 12, to move the wafer W by a predetermined stroke, the conventional apparatus 56 needs an arm 58 having a length R which is approx. ½ of the predetermined stroke. On the other hand, in the transfer apparatus 2 of the invention, it suffices if the arms 10, 12, 18, and 20 have a length of approx. ⅜ of R. This means that, in the transfer apparatus 2, a satisfactory stroke can be obtained by using relatively short arms, and hence the entire apparatus can be made smaller than the conventional one.

Thus, where the transfer apparatus of the invention is applied in a semiconductor treatment apparatus, short arms having a small radius of rotation can be used, and accordingly the load lock chamber for receiving these short arms can be made compact. Further, the thicknesses of the connecting portions between the fork 48 and outer arms 18 and 20 are substantially equal to those of the bearings 50 and 51, respectively, so that the passage 3 allowing the load lock chamber 6 to communicate with the process chamber 4 can be made narrower than that in cases where a conventional apparatus such as a frog-leg-type transfer apparatus is used. Thus, the gate apparatus 5 having the passage 3 can be made smaller.

Moreover, the thin-platelike fork 48 attached to the ends of the outer arms 18 and 20 can be made longer than in the conventional apparatus. Therefore, the wafer can be disposed even in a narrow passage for performing gas treatment.

Though, in the above embodiment, the upper and lower belts 15a and 15b are provided to bridge the first and second pulleys 14 and 16, these belts may be replaced with cords. Cords also can transmit rotation of a driving source without friction, which prevents particles of the belts and pulleys from being produced due to friction, and which needs no grease. Accordingly, there is no occurrence of disadvantageous materials in such a clean vacuum room as a load lock chamber. A single or endless thin cord can be used in place of the upper and lower belts 15a and 15b. In this case, the cord has upper and lower cord portions corresponding to the belts.

Figure 14:
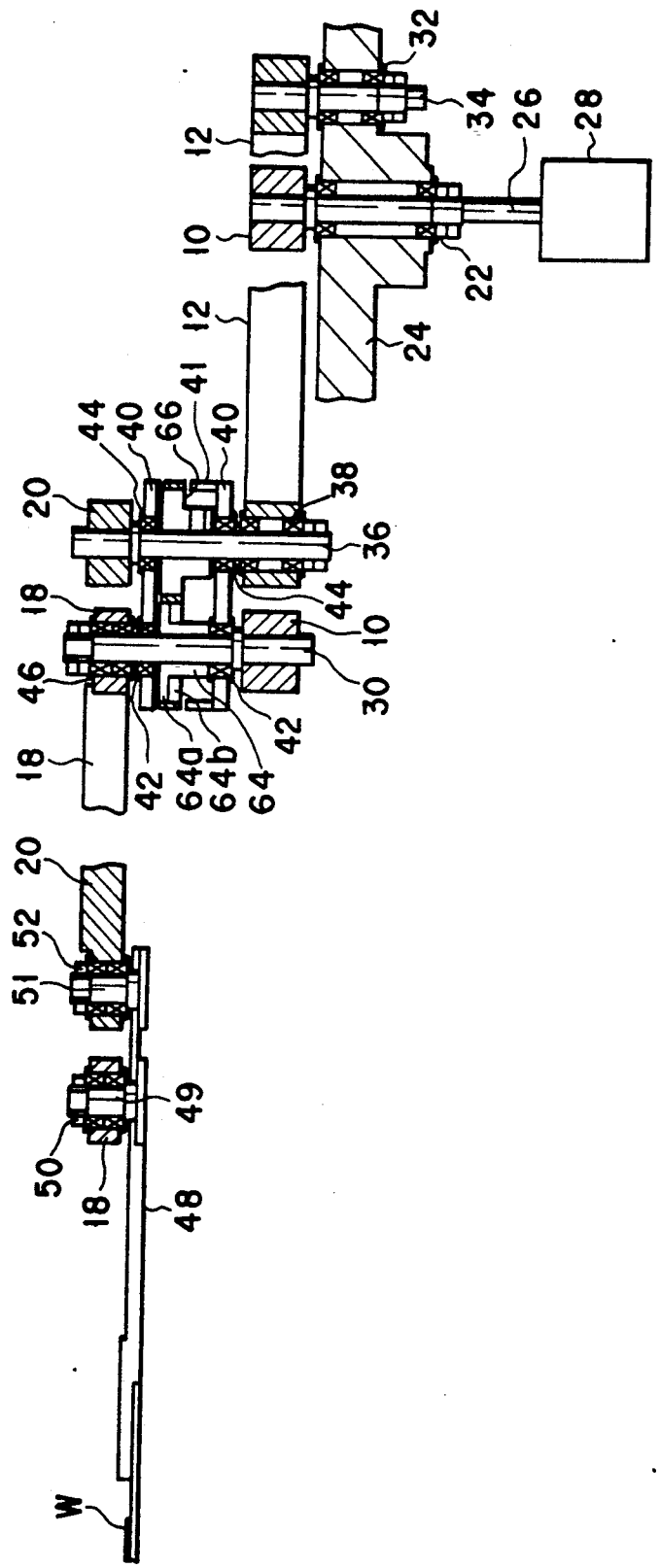
FIG. 14 is a cross sectional view, showing a transfer apparatus according to a second embodiment of the invention.

FIG. 14 is a cross sectional view, showing a transfer apparatus according to a second embodiment of the invention. In FIG. 14, elements corresponding to those in FIG. 1 directed to the first embodiment are denoted by reference numerals identical to the corresponding elements, and explanation thereof is omitted.

The second embodiment differs from the first one in the structure for transmitting a driving force from the first coupling shaft 30 to the second coupling shaft 36. In the second embodiment, first transmission means 64 of a gear structure is secured to the first coupling shaft 30 between the upper and lower holding plates 40. Similarly, second transmission means 66 of a gear structure is secured to the second coupling shaft 36, and is engaged with the first transmission means 64.

The first transmission means 64 consists of upper and lower gear elements 64a and 64b. These gear elements are urged by a built-in spring in radial directions opposite to each other, respectively, in a conventional manner. That is, one of the gear elements 64a and 64b is urged at all times toward the second transmission means or gear 66, thereby preventing play from being caused between the gears 64 and 66.

By virtue of the above structure, the rotational force of the first coupling shaft 30 is transmitted to the second coupling shaft 36 to thereby rotate the same in a direction opposite to that of rotation of the shaft 30 in the second embodiment as in the first embodiment. Specifically, also in the second embodiment, clockwise rotation of the driving shaft 26 indicated by the arrow A causes counterclockwise rotation of the second driving shaft 36 indicated by the arrow B, as is shown in FIG. 2, and accordingly the arms 10, 12, 18, and 20 operate in the above-described manner.

Figure 15:
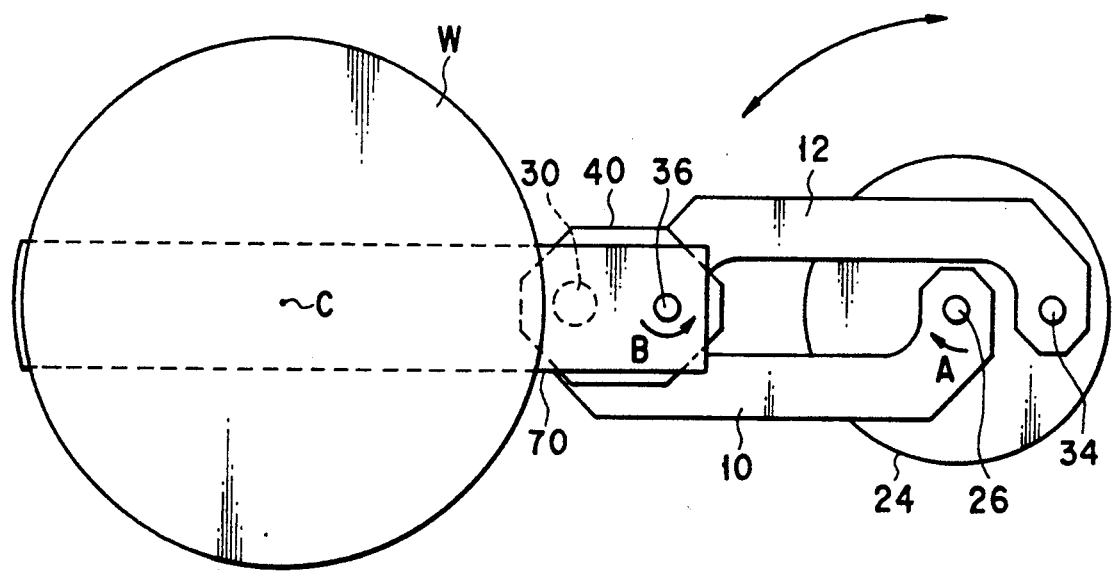
FIG. 15 is a cross sectional view, showing a transfer apparatus according to a third embodiment of the invention.

FIG. 15 shows a transfer apparatus according to a third embodiment of the invention. In FIG. 15, elements corresponding to those in FIG. 1 directed to the first embodiment are denoted by reference numerals identical to the corresponding elements, and explanation thereof is omitted.

In the third embodiment, there are provided no elements corresponding to the outer arms 18 and 20, but a wafer fork 70 is fixed to the second coupling shaft 36. The fork 70 is disposed so as not to interfere with the first coupling shaft 30. In the third embodiment, the structure for transmitting a driving force from the first coupling shaft 30 to the second coupling shaft 36 may be similar to that employed in the first or second embodiment.

The fork 70 is set such that the distance between the center C of the wafer W held by the fork and the shaft 36 is equal to that between the shafts 36 and 34 (i.e., the center C could be positioned in a point corresponding to the shaft 51 of the second outer arm 20 as shown in FIG. 2). More particularly, the distance between a substantially center portion of the wafer (article) and the second coupling shaft is equal to the distance between the pivotal point and the second coupling shaft. As can be understood from this, the fork 70 corresponds to the second outer arm 20, and operates in the locus thereof.

Though the wafer W placed on the fork 70 is linearly transferred in the one-dot-chain line shown in FIG. 8, the direction of the wafer w gradually varies in accordance with rotation of the fork 70, as can be imagined from the movement of the arm 20 shown in FIGS. 9 to 11. Therefore, the apparatus of the third embodiment is useful where it is not inconvenient even if the direction of the wafer W varies, or if the layout of a peripheral member such as a cassette is determined in view of change of the direction of the wafer.

Further, though in the above-described embodiments, the transfer apparatus is located in the load lock chamber of a semiconductor processing apparatus where one wafer is processed at a time, the invention is not limited to this, but may be applicable to various cases where articles are transferred in a narrow space.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A transfer apparatus for transferring an article, comprising:

a base;

a rotary driving source mounted on the base, the driving source having a rotary driving shaft;

a first arm having an end fixed to the rotary driving shaft;

a first coupling shaft fixed to the other end of the first arm;

a second arm having an end supported by the base such that said second arm can pivot about a pivotal point;

a second coupling shaft rotatably supported by the other end of the second arm, the distance between the pivotal point and the second coupling shaft being equal to that between the rotary driving shaft and the first coupling shaft;

a holding member for rotatably holding the first and second coupling shafts, the distance between the first and second coupling shafts being equal to that between the rotary driving shaft and the pivotal point, a straight line connecting the first and second coupling shafts to each other being parallel to a straight line connecting the rotary driving shaft to the pivotal point;

a first pulley secured to the first coupling shaft, and having a first upper portion and a second lower portion;

a second pulley secured to the second coupling shaft, and having a first upper portion and a second lower portion which are opposite to the first and second portions of the first pulley, respectively;

a first belt bridging the first portions of the first and second pulleys, and having one end-side portion wound on clockwise and secured to the first portion of the first pulley and the other-end side portion wound on clockwise and secured to the first portion of the second pulley;

a second belt bridging the second portions of the first and second pulleys so as to cross said first belt, and having one end-side portion wound on counterclockwise and secured to the second portion of the first pulley and the other-end side portion wound on counterclockwise and secured to the second portion of the second pulley;

a supporting plate having an end fixed to the second coupling shaft; and a supporting portion formed on another end of the supporting plate for supporting the article, the supporting portion being formed such that the distance between a substantial center of the article and the second coupling shaft is equal to the distance between the pivotal point and the second coupling shaft.

2. The transfer apparatus according to claim 1, wherein the supporting portion comprises a portion for supporting a substantially circular semiconductor wafer.

3. The transfer apparatus according to claim 1, wherein the holding member has a pair of holding plates located with the first and second pulleys, and the first and second belts interposed therebetween and fixed to each other.

4. A transfer apparatus for transferring an article, comprising:

a base;

a rotary driving source mounted on the base, the driving source having a rotary driving shaft;

a first arm having an end fixed to the rotary driving shaft;

a first coupling shaft fixed to the other end of the first arm;

a second arm having an end supported by the base such that said second arm can pivot about a pivotal point;

a second coupling shaft rotatably supported by the other end of the second arm, the distance between the pivotal point and the second coupling shaft being equal to that between the rotary driving shaft and the first coupling shaft;

a holding member for rotatably holding the first and second coupling shafts, the distance between the first and second coupling shafts being equal to that between the rotary driving shaft and the pivotal point, a straight line connecting the first and second coupling shafts to each other being parallel to a straight line connecting the rotary driving shaft to the pivotal point;

a first pulley secured to the first coupling shaft, and having a first upper portion and a second lower portion;

a second pulley secured to the second coupling shaft, and having a first upper portion and a second lower portion which are opposite to the first and second portions of the first pulley, respectively;

a first belt bridging the first portions of the first and second pulleys, and having one end-side portion wound on clockwise and secured to the first portion of the first pulley and the other-end side portion wound on clockwise and secured to the first portion of the second pulley;

a second belt bridging the second portions of the first and second pulleys so as to cross said first belt, and having one end-side portion wound on counter clockwise and secured to the second portion of the first pulley and the other-end side portion wound on counter clockwise and secured to the second portion of the second pulley;

a first outer arm having an end rotatably supported by the first coupling shaft;

a second outer arm having an end fixed to the second coupling shaft;

a supporting plate having an end connected to the other ends of the first and second outer arms, the first and second outer arms being connected to the supporting plate such that they can rotate about first and second points, respectively, the distance between the first coupling shaft and the first point being equal to that between the rotary driving shaft and the first coupling shaft, and also equal to the distance between the second coupling shaft and the second point, the distance between the first and second points being equal to that between the first and second coupling shafts, a straight line connecting between the first and second points being parallel to that connecting between the first and second coupling shafts; and a supporting portion formed on another end of the supporting plate for supporting the article.

5. The transfer apparatus according to claim 4, wherein the supporting portion comprises a portion for supporting a substantially circular semiconductor wafer.

6. The transfer apparatus according to claim 4, wherein the holding member has a pair of holding plates located with the first and second pulleys, and the first and second belts interposed therebetween and fixed to each other.

7. A processing system for processing a substrate, comprising:

a process chamber in which the substrate is processed;

a support arranged in the process chamber for supporting the substrate which is being processed;

a load lock chamber connected to the process chamber through a communication mechanism for having the pressure therein reduced to a vacuum;

a gate connected to the communication mechanism for opening and closing the communication mechanism;

a transfer apparatus arranged in the load lock chamber for transferring the substrate, in a vacuum atmosphere, between the load lock chamber and the support in the process chamber through the communication mechanism, the transfer apparatus comprising:

a base arranged in the load lock chamber;

a rotary drive source mounted on the base, the driving source having a rotary driving shaft;

a first arm having an end fixed to the rotary driving shaft;

a first coupling shaft fixed to the other end of the first arm;

a second arm having an end supported by the base such that said second arm can pivot about a pivotal point;

a second coupling shaft rotatably supported by the other end of the second arm, the distance between the pivotal point and the second coupling shaft being equal to that between the rotary driving shaft and the coupling shaft;

a holding member for rotatably holding the first and second coupling shafts, the distance between the first and second coupling shafts being equal to that between the rotary driving shaft and the pivotal point, a straight line connecting the first and second coupling shafts to each other being parallel to a straight line connecting the rotary driving shaft to the pivotal point;

a first pulley secured to the first coupling shaft, and having a first upper portion and a second lower portion;

a second pulley secured to the second coupling shaft, and having a first upper portion and a second lower portion which are opposite to the first and second portions of the first pulley, respectively;

a first belt bridging the first portions of the first and second pulleys, and having one end-side portion wound on clockwise and secured to the first portion of the first pulley and the other-end side portion wound on clockwise and secured to the first portion of the second pulley;

a second belt bridging the second portions of the first and second pulleys so as to cross said first belt, and having one end-side portion wound on counterclockwise and secured to the second portion of the first pulley and the other-end side portion wound on counterclockwise and secured to the second portion of the second pulley;

a first outer arm having an end rotatably supported by the first coupling shaft;

a second outer arm having an end fixed to the second coupling shaft;

a supporting plate having an end connected to the other ends of the first and second outer arms, the first and second outer arms being connected to the supporting plate such that they can rotate about first and second points, respectively, the distance between the first coupling shaft and the first point being equal to that between the rotary driving shaft and the first coupling shaft, and also equal to the distance between the second coupling shaft and the second point, the distance between the first and second points being equal to that between the first and second coupling shafts, a straight line connecting between the first and second points being parallel to that connecting between the first and second coupling shafts; and a supporting portion formed on another end of the supporting plate for supporting the substrate wherein the first and second pulleys and the first and second belts comprise a transmission for suppressing particles generated therefrom due to friction in the load lock chamber and the process chamber.

8. The system according to claim 7, wherein the supporting portion of the transfer apparatus comprises a portion for supporting a substantially circular semiconductor wafer.

9. The system according to claim 7, wherein the holding member of the apparatus has a pair of holding plates located with the first and second pulleys, and the first and second belts interposed therebetween and fixed to each other.

10. The system according to claim 7, wherein the supporting means in the process chamber comprises a susceptor on which the substrate is mounted.

11. The system according to claim 10, wherein one substrate is processed at a time in the process chamber.

12. The system according to claim 7, wherein the first and second belt of the transfer apparatus comprise stainless steel.

13. The system according to claim 7, wherein said one-end side portions of the first and second belts of the transfer apparatus are secured to the first pulley at first and second positions, respectively, which are adjacent to each other, and said other-end side portions of the first and second belts are secured to the second pulley at third and fourth positions, respectively, which are adjacent to each other, and wherein the first to fourth positions are set such that when the first and second positions are located farthest from the second pulley, the third and fourth portions are located the farthest from the first pulley.

14. The system according to claim 13, wherein the transfer apparatus further comprises a presser plate arranged at each of the first to fourth positions for pressing each of said one-end side and other-end side portions of the first and second belts to a corresponding portion of the first and second pulleys via a fixing device, the presser plate being curved along a corresponding surface of the first and second pulleys.

15. The apparatus as claimed in claim 1, wherein the first and second belt comprise stainless steel.

16. The apparatus according to claim 1, wherein said one-end side portions of the first and second side belts are secured to the first pulley at first and second positions, respectively, which are adjacent to each other, and said other-end side portions of the first and second belts are secured to the second pulley at third and fourth positions, respectively, which are adjacent to each other and wherein the first to fourth positions are set such that when the first and second positions are located farthest from the second pulley, the third and fourth portions are located the farthest from the first pulley.

17. The apparatus according to claim 16, which comprises a presser plate arranged at each of the first to fourth positions for pressing each of said one-end side and other-end side portions of the first and second belts to a corresponding portion of the first and second pulleys via a fixing device, the presser plate being curved along a corresponding surface of the first and second pulleys.

18. The apparatus according to claim 4, wherein the first and second belts comprise stainless steel.

19. The apparatus according to claim 4, wherein said one-end side portions of the first and second side belts are secured to the first pulley at first and second positions, respectively, which are adjacent to each other, and said other-end side portions of the first and second belts are secured to the second pulley at third and fourth positions, respectively, which are adjacent to each other and wherein the first to fourth positions are set such that when the first and second positions are located farthest from the second pulley, the third and fourth portions are located the farthest from the first pulley.

20. The apparatus according to claim 19, which comprises a presser plate arranged at each of the first to fourth positions for pressing each of said one-end side and other-end side portions of the first and second belts to a corresponding portion of the first and second pulleys via a fixing device, the presser plate being curved along a corresponding surface of the first and second pulleys.

* * * * *